(12) United States Patent
Hayayama et al.

(10) Patent No.: US 11,502,530 B2
(45) Date of Patent: Nov. 15, 2022

(54) BATTERY MANAGEMENT DEVICE, BATTERY SYSTEM, AND VEHICLE POWER SUPPLY SYSTEM FOR MANAGING BATTERY STATE OF CHARGE LEVEL WHEN IN NON-USE STATE

(71) Applicant: Panasonic Intellectual Property Management Co., Ltd., Osaka (JP)

(72) Inventors: Kazuya Hayayama, Hyogo (JP); Tomokazu Sada, Osaka (JP); Yukikazu Ohchi, Osaka (JP); Masatoshi Nagayama, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 250 days.

(21) Appl. No.: 16/957,054

(22) PCT Filed: Oct. 25, 2018

(86) PCT No.: PCT/JP2018/039700
§ 371 (c)(1),
(2) Date: Jun. 22, 2020

(87) PCT Pub. No.: WO2019/130774
PCT Pub. Date: Jul. 4, 2019

(65) Prior Publication Data
US 2020/0395775 A1 Dec. 17, 2020

(30) Foreign Application Priority Data
Dec. 26, 2017 (JP) .............................. JP2017-249442

(51) Int. Cl.
*H02J 7/00* (2006.01)
*G01R 31/36* (2020.01)
(Continued)

(52) U.S. Cl.
CPC ............. *H02J 7/0048* (2020.01); *B60L 58/12* (2019.02); *B60L 58/16* (2019.02); *G01R 31/36* (2013.01);
(Continued)

(58) Field of Classification Search
CPC ...... H02J 7/0048; H02J 7/007; H01M 10/482; B60L 58/12; G01R 31/36
(Continued)

(56) References Cited

U.S. PATENT DOCUMENTS 3,794,905 A * 2/1974 Long ................. H02J 7/007184
320/161
5,514,946 A * 5/1996 Lin ..................... H02J 7/00036
702/187
(Continued)

FOREIGN PATENT DOCUMENTS

JP 2009005450 A 1/2009
JP 2016012989 A 1/2016

OTHER PUBLICATIONS

International Search Report issued in corresponding International Patent Application No. PCT/JP2018/039700, dated Nov. 20, 2018, with English translation.

*Primary Examiner* — John T Trischler
(74) *Attorney, Agent, or Firm* — McDermott Will & Emery LLP

(57) ABSTRACT

A state estimator estimates, based on at least one of a voltage, a current, and a temperature of a secondary battery, a state of the secondary battery including a state of charge (SOC) of the secondary battery. A discharge controller discharges, when a state of non-use of the secondary battery lasts for a predetermined period of time, the secondary battery such that an indicator indicating easiness of storage deterioration of the secondary battery to progress decreases in stages. The indicator includes a parameter that depends on (Continued)

an SOC of the secondary battery. A value of the indicator and a duration of stay in each stage are set such that a predetermined relationship holds between products in a plurality of stages, each of the products being derived from multiplying the value of the indicator and the duration of stay in each stage.

16 Claims, 6 Drawing Sheets

(51) Int. Cl.
  *B60L 58/16* (2019.01)
  *B60L 58/12* (2019.01)
  *H01M 10/48* (2006.01)

(52) U.S. Cl.
  CPC ........... *H01M 10/482* (2013.01); *H02J 7/007* (2013.01); *H02J 7/0069* (2020.01); *H02J 7/0071* (2020.01); *B60L 2240/545* (2013.01); *B60L 2240/547* (2013.01); *B60L 2240/549* (2013.01); *H01M 10/48* (2013.01); *H02J 2310/48* (2020.01)

(58) Field of Classification Search
  USPC ......................................................... 320/132
  See application file for complete search history.

(56) References Cited

U.S. PATENT DOCUMENTS

| | | | | |
|---|---|---|---|---|
| 5,545,969 A * | 8/1996 | Hasegawa | H02J 7/008 | 320/152 |
| 5,680,030 A * | 10/1997 | Kadouchi | H01M 10/613 | 320/152 |
| 5,703,466 A * | 12/1997 | Honda | H02J 7/00712 | 320/152 |
| 5,903,131 A * | 5/1999 | Sekine | H02J 7/00047 | 320/112 |
| 5,994,877 A * | 11/1999 | Seri | G01R 31/3835 | 320/132 |
| 6,060,864 A * | 5/2000 | Ito | H02J 7/00302 | 320/136 |
| 6,061,304 A * | 5/2000 | Nagata | G04G 19/12 | 368/64 |
| 6,064,179 A * | 5/2000 | Ito | H02J 7/0063 | 320/128 |
| 6,097,176 A * | 8/2000 | Yao | H01M 10/44 | 320/132 |
| 6,462,507 B2 * | 10/2002 | Fisher, Jr. | H02J 7/35 | 307/66 |
| 6,480,003 B1 * | 11/2002 | Ugaji | H01M 10/48 | 320/132 |
| 6,573,685 B2 * | 6/2003 | Nakanishi | G01R 31/396 | 320/122 |
| 6,583,606 B2 * | 6/2003 | Koike | H02J 7/0069 | 320/149 |
| 6,984,961 B2 * | 1/2006 | Kadouchi | B60L 58/15 | 320/132 |
| 7,157,881 B1 * | 1/2007 | Benckenstein, Jr. | H02J 7/0016 | 320/119 |
| 7,429,436 B2 * | 9/2008 | Atehortua | G01R 31/379 | 320/132 |
| 7,688,033 B2 * | 3/2010 | Minamiura | H02J 7/0047 | 320/136 |
| 7,746,026 B2 * | 6/2010 | Koziara | H01M 10/44 | 324/426 |
| 7,974,796 B2 * | 7/2011 | Tamai | G01R 31/3828 | 702/63 |
| 7,977,916 B2 * | 7/2011 | Hayakawa | H02J 7/00304 | 320/132 |
| 8,154,299 B2 * | 4/2012 | Iida | H01M 10/425 | 320/132 |
| 8,264,206 B2 * | 9/2012 | Sim | H02J 9/005 | 320/132 |
| 8,380,452 B2 * | 2/2013 | Maegawa | G01R 31/396 | 702/182 |
| 8,742,726 B2 * | 6/2014 | Park | B60W 30/18054 | 320/132 |
| 8,785,023 B2 * | 7/2014 | Horne | H01M 8/188 | 429/105 |
| 8,836,285 B2 * | 9/2014 | Yamada | H02J 7/0022 | 320/126 |
| 9,086,463 B2 * | 7/2015 | Tamura | G01R 31/392 | |
| 9,106,104 B2 * | 8/2015 | Kinjo | H01M 10/443 | |
| 9,260,033 B2 * | 2/2016 | Hayashida | G01R 31/382 | |
| 9,428,072 B2 * | 8/2016 | Chang | B60L 58/16 | |
| 9,620,978 B2 * | 4/2017 | Boschker | B60L 58/12 | |
| 9,709,635 B2 * | 7/2017 | Zhong | G01R 31/3828 | |
| 10,026,998 B2 * | 7/2018 | Li | B60L 3/12 | |
| 10,135,267 B2 * | 11/2018 | Sasaki | B60L 58/13 | |
| 10,162,014 B2 * | 12/2018 | Iida | H02J 7/005 | |
| 10,355,509 B2 * | 7/2019 | Sada | H02J 7/007192 | |
| 10,608,446 B1 * | 3/2020 | Odegaard | H02J 7/027 | |
| 10,698,036 B2 * | 6/2020 | Kobayashi | G01R 31/392 | |
| 10,784,812 B2 * | 9/2020 | Berkowitz | H02J 3/381 | |
| 10,838,013 B2 * | 11/2020 | Tenmyo | G01R 31/392 | |
| 10,840,720 B2 * | 11/2020 | Yebka | H02J 7/0049 | |
| 11,108,249 B2 * | 8/2021 | King | H02J 7/0045 | |
| 11,275,122 B2 * | 3/2022 | Sada | G01R 31/392 | |
| 2001/0035737 A1 * | 11/2001 | Nakanishi | H02J 7/0021 | 320/122 |
| 2001/0043050 A1 * | 11/2001 | Fisher, Jr. | H02J 7/35 | 320/101 |
| 2003/0146737 A1 * | 8/2003 | Kadouchi | B60L 58/14 | 320/132 |
| 2005/0017685 A1 * | 1/2005 | Rees | G01R 31/392 | 320/132 |
| 2006/0001399 A1 * | 1/2006 | Salasoo | B60L 58/25 | 320/104 |
| 2006/0066285 A1 * | 3/2006 | Minamiura | G01R 31/389 | 320/132 |
| 2006/0176026 A1 * | 8/2006 | Shen | H02J 7/0069 | 320/135 |
| 2006/0276304 A1 * | 12/2006 | Jensen | F02D 29/02 | 123/339.14 |
| 2006/0284601 A1 * | 12/2006 | Salasoo | B60L 58/27 | 320/150 |
| 2007/0090792 A1 * | 4/2007 | Sim | H02J 9/005 | 320/112 |
| 2007/0262750 A1 * | 11/2007 | Yun | G01R 31/374 | 320/132 |
| 2008/0053715 A1 * | 3/2008 | Suzuki | B60L 58/12 | 320/136 |
| 2008/0100267 A1 * | 5/2008 | Shen | H02J 7/0069 | 320/137 |
| 2008/0150490 A1 * | 6/2008 | Koziara | B60L 3/0046 | 320/137 |
| 2008/0224662 A1 * | 9/2008 | Hayakawa | H02J 7/0069 | 320/135 |
| 2009/0212742 A1 * | 8/2009 | Sim | H02J 9/005 | 320/134 |
| 2010/0001693 A1 * | 1/2010 | Iida | H01M 10/425 | 324/427 |
| 2010/0072948 A1 * | 3/2010 | Sun | G01R 31/367 | 320/134 |
| 2010/0250163 A1 * | 9/2010 | Maegawa | G01R 31/3842 | 702/63 |
| 2011/0012560 A1 * | 1/2011 | Sakakibara | H01M 10/441 | 320/118 |
| 2011/0082621 A1 * | 4/2011 | Berkobin | B60L 58/16 | 701/31.4 |
| 2011/0121786 A1 * | 5/2011 | Tsuruta | H01M 10/443 | 320/132 |
| 2011/0210698 A1 * | 9/2011 | Sakai | H02J 7/0071 | 320/109 |
| 2012/0212183 A1 * | 8/2012 | Yamada | H02J 3/32 | 320/134 |

(56) References Cited

U.S. PATENT DOCUMENTS

| | | | |
|---|---|---|---|
| 2012/0223670 A1* | 9/2012 | Kinjo | H02J 7/35 320/135 |
| 2012/0248876 A1* | 10/2012 | Tamura | G01R 31/392 307/66 |
| 2013/0113435 A1* | 5/2013 | Boschker | G01C 21/26 320/134 |
| 2013/0127611 A1* | 5/2013 | Bernstein | B60L 3/0046 340/455 |
| 2013/0307551 A1* | 11/2013 | Makino | G01R 31/3835 324/434 |
| 2013/0314047 A1* | 11/2013 | Eagle | H02J 7/0086 320/127 |
| 2014/0316728 A1* | 10/2014 | Zhong | G01R 31/374 702/63 |
| 2014/0320062 A1* | 10/2014 | Murayama | B60L 58/13 320/134 |
| 2015/0048802 A1* | 2/2015 | Tani | B60L 58/13 320/149 |
| 2015/0097524 A1* | 4/2015 | Paik | B60L 58/22 320/109 |
| 2015/0188482 A1* | 7/2015 | Berkowitz | H02J 3/32 320/101 |
| 2015/0191098 A1* | 7/2015 | Chang | B60L 58/16 701/22 |
| 2015/0293183 A1* | 10/2015 | Tenmyo | H02J 7/0049 324/429 |
| 2015/0329003 A1* | 11/2015 | Li | B60L 53/66 320/134 |
| 2016/0025818 A1* | 1/2016 | Bourilkov | H01M 6/505 429/93 |
| 2016/0105044 A1* | 4/2016 | Yamaguchi | H01M 10/482 320/112 |
| 2016/0149420 A1* | 5/2016 | Sasaki | B60L 50/64 320/134 |
| 2016/0252582 A1* | 9/2016 | Iida | H01M 10/425 702/63 |
| 2017/0088072 A1* | 3/2017 | Curtis | G08B 31/00 |
| 2017/0160349 A1* | 6/2017 | Iida | G01R 31/3648 |
| 2017/0184683 A1* | 6/2017 | Kobayashi | G01R 31/392 |
| 2017/0229878 A1* | 8/2017 | Kim | H02J 7/007 |
| 2017/0282737 A1* | 10/2017 | Miller | B60W 50/0097 |
| 2017/0338668 A1* | 11/2017 | Sada | H02J 7/0068 |
| 2018/0186244 A1* | 7/2018 | Harvey | B60L 3/04 |
| 2018/0257492 A1* | 9/2018 | O'Hara | H02J 7/0068 |
| 2018/0323478 A1* | 11/2018 | Paulsen | H01M 10/4257 |
| 2019/0058352 A1* | 2/2019 | Gow | G06F 11/3058 |
| 2019/0064849 A1* | 2/2019 | O'Hara | H02J 7/0029 |
| 2019/0067961 A1* | 2/2019 | King | H02J 7/0045 |
| 2019/0113580 A1* | 4/2019 | Tenmyo | G01R 31/3842 |
| 2019/0120909 A1* | 4/2019 | Koizumi | H02J 7/00714 |
| 2019/0170831 A1* | 6/2019 | Sada | H01M 10/44 |
| 2019/0305564 A1* | 10/2019 | Yebka | H02J 7/0049 |
| 2019/0308522 A1* | 10/2019 | Bardot | B60L 58/20 |
| 2020/0062123 A1* | 2/2020 | Harvey | B60L 3/12 |
| 2020/0091734 A1* | 3/2020 | Odegaard | H02J 7/0048 |
| 2020/0127481 A1* | 4/2020 | Axelsson | B60L 58/12 |
| 2020/0251921 A1* | 8/2020 | Lee | H01M 10/486 |
| 2020/0381784 A1* | 12/2020 | Yamamoto | H02J 7/04 |
| 2020/0403428 A1* | 12/2020 | Bah | H01M 50/256 |
| 2020/0408842 A1* | 12/2020 | Sada | H02J 7/0031 |
| 2021/0021000 A1* | 1/2021 | Sada | H02J 7/0048 |
| 2021/0094438 A1* | 4/2021 | Ciccone | F02D 41/26 |
| 2021/0158291 A1* | 5/2021 | Kita | B60L 53/63 |
| 2021/0170905 A1* | 6/2021 | Cho | H02J 7/0014 |
| 2021/0221243 A1* | 7/2021 | Kawamoto | B60L 53/65 |
| 2021/0318386 A1* | 10/2021 | Itakura | H01M 10/48 |
| 2021/0339650 A1* | 11/2021 | Hashimoto | B60L 15/20 |
| 2021/0379999 A1* | 12/2021 | Yang | B60L 58/12 |

* cited by examiner

BATTERY MANAGEMENT DEVICE, BATTERY SYSTEM, AND VEHICLE POWER SUPPLY SYSTEM FOR MANAGING BATTERY STATE OF CHARGE LEVEL WHEN IN NON-USE STATE

CROSS-REFERENCE OF RELATED APPLICATIONS

This application is the U.S. National Phase under 35 U.S.C. § 371 of International Patent Application No. PCT/JP2018/039700, filed on Oct. 25, 2018, which in turn claims the benefit of Japanese Application No. 2017-249442, filed Dec. 26, 2017, the entire disclosures of which Applications are incorporated by reference herein.

TECHNICAL FIELD

The present disclosure relates to battery management devices, battery systems, and power supply systems for vehicles.

BACKGROUND ART

In recent years, the demand for lithium ion batteries has grown. Lithium ion batteries are used in various applications such as vehicle-mounted applications (e.g., HEV, PHEV, EV), stationary storage battery applications, electronic device applications (e.g., notebook PCs, smartphones, etc.). In particular, the number HEVs, PHEVs, and EVs shipped has increased, and more and more lithium ion batteries for vehicle-mounted applications are shipped.

EVs and power storage systems for home use may not be used for a long time when, for example, the user is away from home for a long time. In the case batteries in these systems are stored for a long period of time and are left at rest in a high SOC state, storage deterioration progresses at a high rate. For suppression of storage deterioration of batteries, it has been proposed to maintain SOC relatively low in a time zone when it is highly likely that discharge is unnecessary (see, for example, patent literature 1) or to delay the start of charge when it is predicted that the vehicle will be at a stop for a long period of time (see, for example, patent literature 2).
[Patent Literature 1] JP2016-12989
[Patent Literature 2] JP2009-5450

SUMMARY OF INVENTION

Technical Problem

Meanwhile, a battery system is required to discharge capacity at a necessary point of time and in a necessary quantity. If SOC is maintained too low during long-term storage of a battery mounted on a vehicle, for example, the travel distance available when the vehicle is used after long-term storage will be shortened.

The disclosure addresses the above-described issue, and a general purpose thereof is to provide a technology capable of meeting both the need to suppress deterioration during long-term storage of a secondary battery and the need to secure available discharge capacity when the battery is used after long-term storage.

Solution to Problem

A battery management device according to an embodiment includes: a state estimator that estimates, based on at least one of a voltage, a current, and a temperature of a secondary battery, a state of the secondary battery including a state of charge (SOC) of the secondary battery; and a discharge controller that discharges, when a state of non-use of the secondary battery lasts for a predetermined period of time, the secondary battery such that an indicator indicating easiness of storage deterioration of the secondary battery to progress decreases in stages. The indicator includes a parameter that depends on an SOC of the secondary battery, and a value of the indicator and a duration of stay in each stage are set such that a predetermined relationship holds between products in a plurality of stages, each of the products being derived from multiplying the value of the indicator and the duration of stay in each stage.

Optional combinations of the aforementioned constituting elements, and implementations of the disclosure in the form of methods, apparatuses, systems, and computer programs may also be practiced as additional modes of the present disclosure.

Advantageous Effects of Invention

According to the present disclosure, both the need to suppress deterioration during long-term storage of a secondary battery and the need to secure available discharge capacity when the battery is used after long-term storage.

DESCRIPTION OF EMBODIMENTS

Figure 1:
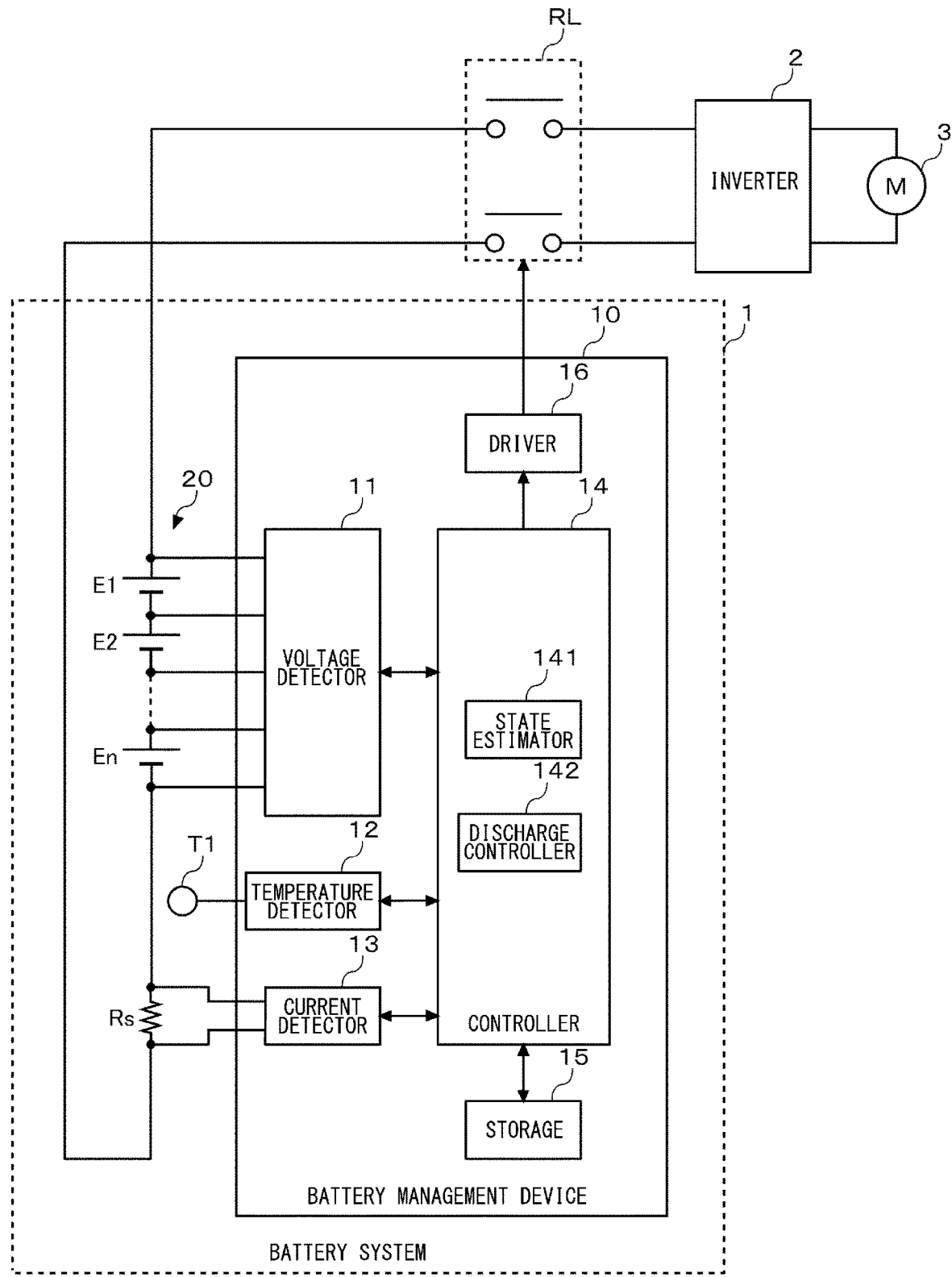
FIG. 1 shows a schematic configuration of a battery system according to an embodiment of the present disclosure.

FIG. 1 shows a schematic configuration of a battery system 1 according to an embodiment of the present disclosure. The example shown in FIG. 1 is an example in which the battery system 1 according to the embodiment is mounted on a vehicle as a battery for driving the vehicle. The battery system 1 is connected to a motor 3 via a relay RL and an inverter 2. During powering, the inverter 2 converts the DC power supplied from the battery system 1 into an AC power and supplies the AC power to the motor 3. During regeneration, the inverter 2 converts the AC power supplied from the motor 3 into a DC power and supplies the DC power to the battery system 1. The relay RL is an example of an element for electrically disconnecting the battery system 1 and the vehicle. An alternative type of element may be used so long as the element includes a switching function capable of cutting off a current therebetween.

The battery system 1 includes a secondary battery 20 and a battery management device 10. The secondary battery 20 is formed by connecting a plurality of cells E1-En in series. A lithium ion battery, a nickel hydride battery, a lead battery, etc. can be used as the cell. Hereinafter, an example of using a lithium ion battery cell (nominal voltage: 3.6-3.7 V) will be assumed in this specification. The number of cells in series connection is determined in accordance with the voltage of the motor 3.

A shunt resistance Rs is connected in series with the plurality of cells E1-En. The shunt resistance Rs functions as a current detection device. A Hall device may be used in place of the shut resistance Rs. Further, a temperature sensor T1 for detecting the temperature of the plurality of cells E1-En is provided. A thermistor can be used as the temperature sensor T1.

The battery management device 10 includes a voltage detector 11, a temperature detector 12, a current detector 13, a controller 14, a storage 15, and a driver 16. The voltage detector 11 is connected to the nodes of the plurality of cells E1-En connected in series by way of a plurality of voltage lines. The voltage detector 11 detects the voltage across each of the cells E1-En by detecting the voltage between two adjacent voltage lines. The voltage detector 11 outputs the detected voltage of each of the cells E1-En to the controller 14. The voltage detector 11 may be comprised of an application specific integrated circuit (ASIC). The voltage detector 11 includes a multiplexer and an A/D converter. The multiplexer outputs the voltage values of the plurality of cells E1-En to the A/D converter in a predetermined sequence. The A/D converter converts a voltage value of an analog signal input from the multiplexer into a voltage value of a digital signal.

The temperature detector 12 estimates the temperature of the plurality of cells E1-En based on an output value of the temperature sensor T1 and outputs the estimated temperature to the controller 14. The current detector 13 includes an error amplifier connected to the ends of the shunt resistance Rs. The error amplifier detects the voltage across the shunt resistance Rs. The current detector 13 detects the current flowing in the secondary battery 20 based on the voltage across the shunt resistance Rs and outputs the detected current to the controller 14.

For example, the controller 14 can be comprised of a CPU, a digital signal processor (DSP), a field-programmable gate array (FPGA), etc. The detail of the controller 14 will be described later. The storage 15 stores various information. The storage 15 may be comprised of, for example, a nonvolatile memory. The driver 16 generates a drive signal for on/off control of the relay RL in response to a switching command signal from the controller 14 and supplies the drive signal to the relay RL.

The controller 14 manages the secondary battery 20 based on the voltage, current, and temperature of the plurality of cells E1-En detected by the voltage detector 11, the temperature detector 12, and the current detector 13. In the event that an excessive voltage, an excessively low voltage, an excessive current, or an abnormal temperature occurs in at least one of the cells E1-En, for example, the controller 14 causes the driver 16 to turn off the relay RL to protect the cells E1-En. Further, the controller 14 equalizes the cells E1-En.

The controller 14 includes a state estimator 141 and a discharge controller 142 as functional blocks for embodying the functions of note in this embodiment. The state estimator 141 estimates the state of charge (SOC) and state of health (SOH) of the plurality of cells E1-En.

SOC can be estimated by an open circuit voltage (OCV) method or an integrated current method. The OCV method is a method to estimate SOC based on the OCV detected by the voltage detector 11 and the characteristic data for the SOC-OCV curve stored in the storage 15. The integrated current method is a method to estimate SOC based on OCV found when the charge/discharge is started and detected by the voltage detector 11 and on the integrated value of the current detected by the current detector 13.

SOH is defined as a ratio of the current full charge capacity relative to the initial full charge capacity. The smaller the numerical value (the closer to 0%), the further the deterioration has progressed. SOH can be estimated based on the correlationship with the internal resistance. The internal resistance can be estimated by dividing a voltage drop occurring when a predetermined current is caused to flow in the battery for a predetermined period of time by the current. The higher the temperature, the smaller the internal resistance tends to be, and the further the deterioration of the battery progresses, the larger the internal resistance. Deterioration of the battery progresses as the number of times of charging and discharging increases. Deterioration of the battery also depends on individual differences and usage environment. Basically, therefore, the longer the period of use, the more widely the capacitance varies among the plurality of cells E1-En.

The discharge controller 142 discharges the capacitance of the secondary battery 20 to suppress deterioration during long-term storage of the secondary battery 20. The discharge controller 142 generates an indicator indicating easiness of storage deterioration of the secondary battery 20 to progress (hereinafter, referred to as storage deterioration speed indicator in this specification). The discharge controller 42 discharges the secondary battery 20 such that the storage deterioration speed indicator decreases in stages. The storage deterioration speed indicator takes a value in a range 0-100%, and the larger the value, the faster the storage deterioration speed.

The storage deterioration speed indicator includes a parameter that depends on SOC. At least one of SOC and arbitrary parameters (voltage, state of power (SOP), etc.) that vary monotonically with SOC can be used. The cell voltage, module voltage, or system voltage can be used as the voltage. In the case a plurality of cells connected in series are provided, the maximum value of the voltages of the plurality of cells may be used as the cell voltage. Alternatively, an average value may be used. In the case a plurality of modules connected in series are used, the system voltage is a total value of the plurality of module voltages.

The storage deterioration speed indicator may include a parameter that does not depend on the SOC of the secondary battery 20. Parameters that do not depend on SOC include an environmental parameter and a deterioration parameter. Various temperatures (temperature of the surface of the cell, interior of the cell, module, system, atmosphere) can be used as the environmental parameter. The temperature and the storage deterioration speed indicator are related such that the higher the temperature, the further the storage deterioration speed indicator increases. Humidity may be used as the environmental parameter.

At least one of SOH, R—SOH, internal resistance value, full charge capacity, total charge/total discharge capacity, number of cycles, total charge/total discharge time, total hour of use, maximum/minimum voltage history, and maximum/minimum temperature history can be used as the deterioration parameter. The deterioration and the storage deterioration speed indicator are related such that the further the cell deterioration has progressed, the further the storage deterioration speed indicator increases.

Contribution of each parameter to the storage deterioration speed indicator is determined for each type of the secondary battery 20, based on an experiment or simulation. SOC and temperature are parameters that contribute predominantly to the storage deterioration speed indicator.

FIGS. 2A-2D are diagrams showing specific examples of methods of discharging the secondary battery 20 during long-term storage. FIGS. 2A-2D show examples in which the secondary battery 20 is comprised of four cells E1-E4 connected in series.

Figure 2A:
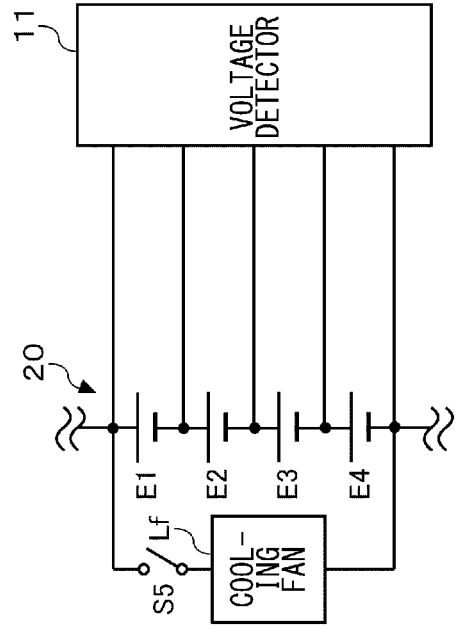
FIGS. 2A-2D are diagrams showing specific examples of methods of discharging the secondary battery during long-term storage.

FIG. 2A is a partial circuit diagram showing a case in which discharge resistances R1-R4 of an equalization circuit are used as the load for discharging the secondary battery 20 during long-term storage. It is common that an equalization process for equalizing the voltage between the plurality of cells E1-En connected in series is performed in a lithium ion battery from the perspective of maintaining power efficiency and securing safety.

In the example shown in FIG. 2A, a discharge circuit is connected across each of the cells E1-E4. The discharge circuit of the cell E1 is comprised of a switch S1 and a discharge resistance R1 connected in series. The discharge circuit of the cells E2-E4 are configured in a manner similar to the discharge circuit of the cell E1. When performing an equalization process, the controller 14 identifies, of the voltages of the plurality of cells E1-E4, the cell having the lowest voltage. The controller 14 controls the switches of the other cells to be in the ON state and discharges the capacity of the other cells to the voltage of the cell having the lowest voltage. This causes the plurality of cells E1-E4 to have a uniform voltage. In the example shown in FIG. 2A, the discharge resistances R1-R4 used in the equalization process are used as the load for discharging the secondary battery 20 during long-term storage.

Figure 2C:
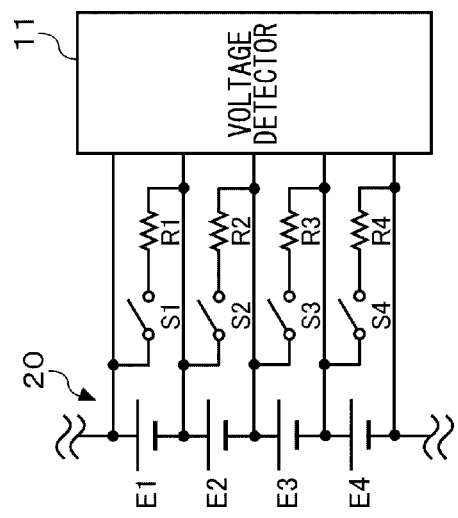
Figure 2B:
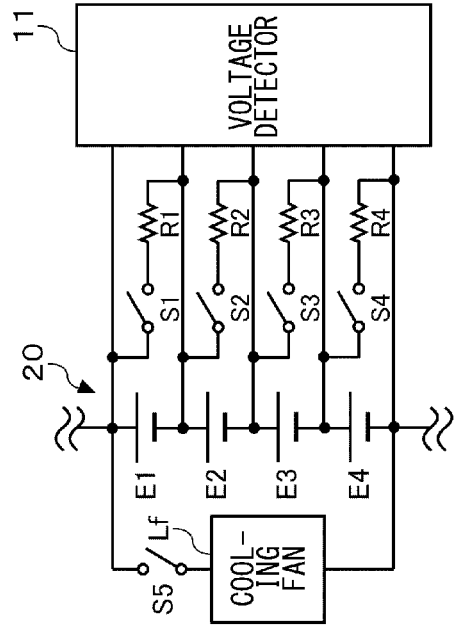

FIG. 2B is a partial circuit diagram showing a case in which a cooling fan Lf is used as the load for discharging the secondary battery 20 during long-term storage. A cooling fan Lf for cooling the secondary battery 20 may be provided in the battery system 1. In large-sized stationary power storage systems, in particular, the cooling fan Lf is often mounted in a power storage rack.

In the example shown in FIG. 2B, the cooling fan Lf is connected across the cells E1-E4 via a switch S5. When the temperature of the cells E1-E4 rises to a predetermined value or higher, the controller 14 controls the switch S5 to be in the ON state to put the cooling fan Lf into operation. This cools the cells E1-E4.

The example shown in FIG. 2B also provides an advantage of lowering the temperature of the cells E1-E4 by putting the cooling fan Lf into operation. Therefore, the example also has an advantage of suppressing storage deterioration by lowering the temperature. As compared with the case of using the discharge resistances R1-R4 shown in FIG. 2A, power consumption is larger so that the discharge time required to lower the SOC of the cells E1-E4 to a target value is reduced.

FIG. 2C is a partial circuit diagram showing a case in which a further secondary battery Eb for buffering is used as the load for discharging the secondary battery 20 during long-term storage. The secondary battery Eb for buffering is connected across the cells E1-E4 via a switch S6. A battery of a characteristic less easily deteriorated than the subject secondary battery 20 is used, or a battery having a higher capacity than the subject secondary battery 20 is used as the secondary battery Eb for buffering. When discharging the secondary battery 20 during long-term storage, the controller 14 controls the switch S6 to be in the ON state to charge the secondary battery Eb for buffering with the capacity discharged from the subject secondary battery 20. When the use of the subject secondary battery 20 is resumed, the secondary battery Eb for buffering is also discharged, increasing the capacity available for use.

Figure 2D:
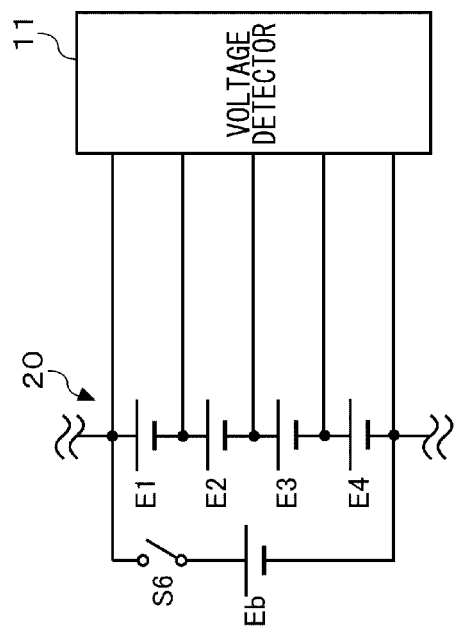

FIG. 2D is a partial circuit diagram showing a case in which both the discharge resistances R1-R4 of the equalization circuit and the cooling fan Lf are used as the load for discharging secondary battery 20 during long-term storage. When discharging the secondary batter 20 during long-term storage, the controller 14 controls the switches S1-S5 to be in the ON state to cause the discharge resistances R1-R4 to conduct electricity and also to put the cooling fan Lf into operation. The cooling fan Lf can also cool the heat dissipated by the discharge resistances R1-R4. This makes it possible to reduce the size the discharge resistances R1-R4 and increase the current rating of the discharge resistances R1-R4. By increasing the current rating of the discharge resistances R1-R4, the current flowing in the discharge resistances R1-R4 is increased, and the discharge time is reduced.

Figure 3:
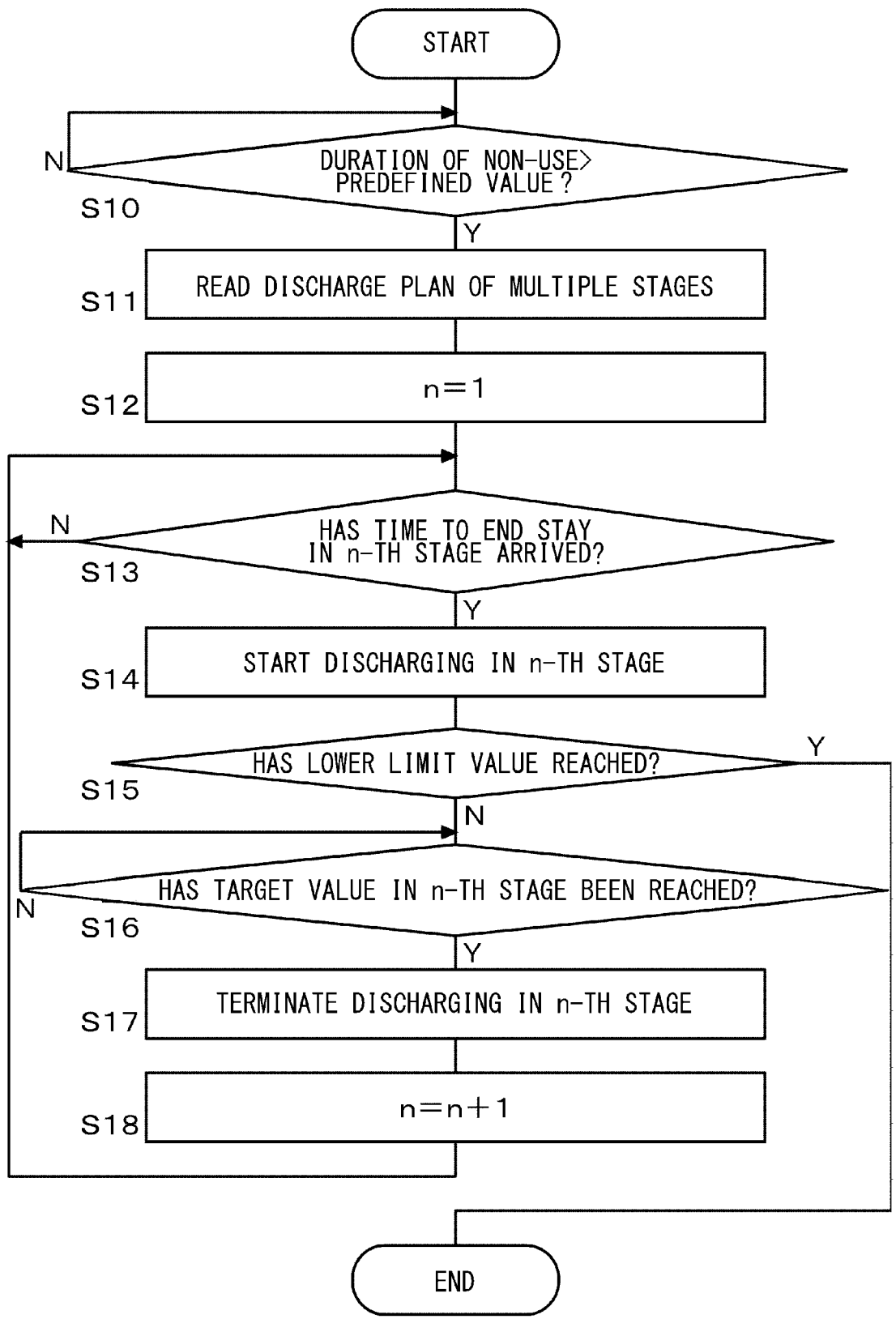
FIG. 3 is a flowchart showing a flow of a discharging process for the secondary battery during long-term storage.

FIG. 3 is a flowchart showing a flow of a discharging process for the secondary battery 20 during long-term storage. When the duration of non-use of the secondary battery 20 exceeds a predefined value (Y in S10), the discharge controller 142 reads a multiple-stage discharge plan of the secondary battery 20 from the storage 15 (S11). The predefined value is configured in accordance with the usage of the secondary battery 20. In the case of EVs, for example, the predefined value is configured to be about one week. In the case of smartphones, the predefined value is configured to be 1-3 days. The discharge plan includes a storage deterioration speed indicator and a duration of stay in each stage. A specific example of a method of determining the storage deterioration speed indicator and the duration of stay will be described later. In the event that an environmental condition such as temperature changes during a discharge process based on a discharge plan (including both the period during a discharging process and the interval between a discharging process and a subsequent discharging process), the detail of the discharge plan can be changed in accordance with the change.

The discharge controller 142 sets 1 as the initial value of a parameter n (S12). When the time to end the stay in the n-th stage arrives (Y in S13), the discharge controller 142 starts discharging in the n-th stage (S14). When the storage deterioration speed indicator reaches the lower limit value (Y in S15), the discharge controller 142 terminates the discharging process during long-term storage of the secondary battery 20. The comparison between the storage deterioration speed indicator and the lower limit value may be made when the discharging step in the n-stage is terminated. When it is found as a result of the comparison that the storage deterioration speed indicator is equal to or lower than the lower limit value, the discharge controller 142 terminates the discharging process during long-term storage without making a transition to the subsequent stage of discharging. The discharging process during long-term storage is also terminated also when normal use of the secondary battery 20 is resumed.

When the storage deterioration speed indicator reaches the target value in the n-th stage (N in S15, N in S16), the discharge controller 142 terminates the discharging step in the n-th stage (S17). The discharge controller 142 increments the parameter n (S18) and makes a transition to step S13.

Figure 4:
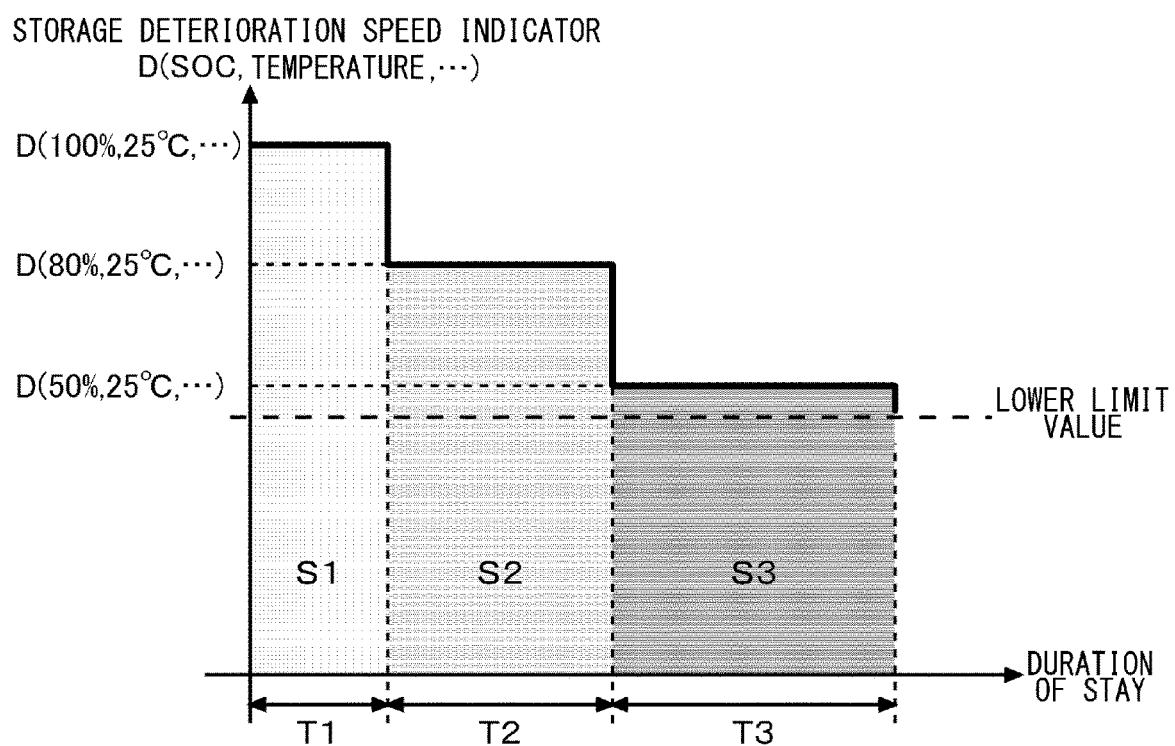
FIG. 4 is a chart illustrating an exemplary discharge plan of the secondary battery stored for a long time.

FIG. 4 is a chart illustrating an exemplary discharge plan of the secondary battery 20 during long-term storage. Basically, storage deterioration depends heavily on SOC and temperature. The higher the SOC level or the higher the temperature, the more easily the storage deterioration progresses. In the example shown in FIG. 4, it is assumed that the temperature is normal (25° C.) and constant, and that the other environmental parameters and deterioration parameters are also constant. In other words, the figure shows a simplified model in which the storage deterioration speed indicator matches the SOC.

In a discharge plan, the relationship between products (hereinafter, referred to as storage-time product) in a plurality of stages is considered, each of the products being derived from multiplying the value of storage deterioration speed indicator (=SOC) and the duration of stay in each stage. In the example shown in FIG. 4, the SOC in the first stage is 100%, the duration of stay is T1, and the storage-time product is S1. The SOC in the second stage is 80%, the duration of stay is T2, and the storage-time product is S2. The SOC in the third stage is 50%, the duration of stay is T3, and the storage-time product is S3. The lower limit of SOC is 45%. The sum S1+S2+S3 of the storage-time products is limited to be equal to or smaller than a predefined upper limit value. This constraint is provided for the purpose of applying a frame on a time scale to the discharging process during long-term storage.

In the embodiment, the duration of stay in a high-SOC zone in which the storage deterioration speed is relatively high is configured to be short, and the duration of stay in a low-SOC zone in which the storage deterioration speed is relatively low is configured to be long. In other words, the duration of stay is configured to be progressively longer through the stages. In the discharge plan according to the example, a decrement $\Delta SOC$ of SOC in a transition between stages is configured to be constant or to be progressively smaller through the stages.

In the discharge plan according to the example, the SOC and the duration of stay in each stage are set such that the storage-time product is progressively larger through the stages (S1<S2<S3). Alternatively, the SOC and the duration of stay in each stage may be set such that the storage-time products in the plurality of stages are substantially equal (S1=S2=S3).

The specific SOC and the duration of stay in each stage may be determined based on a usage record of the battery discharged after long-term storage. The manufacturer or the operation management company of the battery system 1 sample a larger number of items of data for discharged capacity (discharged $\Delta SOC$) discharged by using the battery after long-term storage. The discharged SOC is defined by a difference between the SOC found when the discharging step is started after long-term storage and the SOC found when the discharging step is terminated. The sample data is aggregated for each attribute that makes the modes of using the secondary batteries 20 after long-term storage similar to each other. For example, the sample data is aggregated for each product in which the battery system 1 is mounted. Alternatively, the sample data may be aggregated for each place of destination of the product. The temperature or the user practice varies depending on the place of destination. It will therefore be possible to organize data with a higher precision by organizing the data in consideration of the place of destination.

Figure 5A:
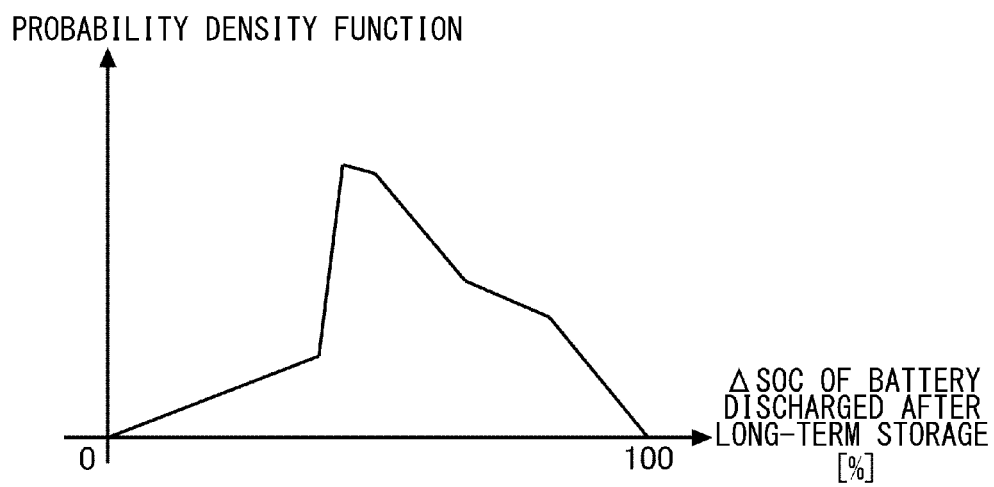
FIGS. 5A and 5B are examples of graphs aggregating the discharged ΔSOC discharged after long-term storage.
Figure 5B:
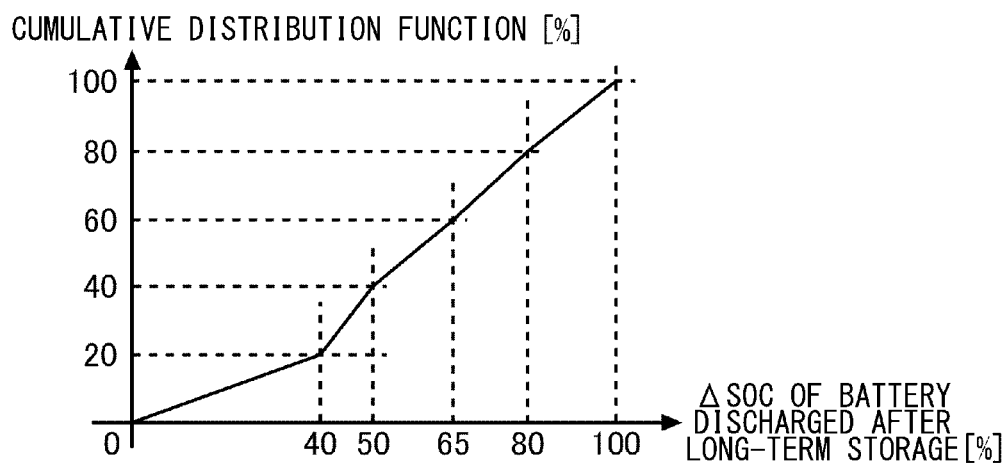

FIGS. 5A and 5B are examples of graphs aggregating the discharged $\Delta SOC$ discharged after long-term storage. FIG. 5A is a graph showing a probability density function (PDF) of the discharged $\Delta SOC$ discharged after long-term storage, and FIG. 5B is a graph showing a cumulative distribution function (CDF) of the discharged $\Delta SOC$ discharged after long-term storage. FIG. 5B is a graph derived by transforming the probability density function of FIG. 5A into the cumulative distribution function.

The graph of FIG. 5A shows that the number of users who discharge about 45% of SOC when discharging the battery after long-term storage is the largest. The designer determines the lower limit value of SOC in a discharging process initiated after long-term storage, based on a usage record of the battery discharged after long-term storage. In this example, the lower limit value of SOC is determined to be 45%. In other words, a capacity of 45% SOC is secured in the secondary battery 20 as the minimum available capacity of the secondary. Values customized for the respective users may be used as the lower limit value of SOC.

The designer determines a proportion between storage-time products in a plurality of stages forming the discharge plan, based on the probability density function of the discharged $\Delta SOC$ discharged after long-term storage. In the examples shown in FIGS. 4 and 5A, the storage-time product S1 in the first stage, the storage-time product S2 in the second stage, and the storage-time product S3 in the third stage are determined such that the ratio defined by the storage-time product S1 in the first stage: the storage-time product S2 in the second stage: the storage-time product S3 in the third stage in the discharge plan and the ratio defined by the area in the probability density function of discharged $\Delta SOC$ corresponding to the first stage: the area in the probability density function of discharged $\Delta SOC$ corresponding to the second stage: the area in the probability density function of discharged $\Delta SOC$ corresponding to the third stage (S1:S2:S3 $\propto$ probability density function of discharged $\Delta SOC$).

The area in the probability density function of discharged $\Delta SOC$ corresponding to the first stage is an area sandwiched by 0% and SOC in the first stage (100% in the case of FIG. 4). The area in the probability density function of discharged $\Delta SOC$ corresponding to the second stage is an area sandwiched by 0% and SOC in the second stage (80% in the case of FIG. 4). The area in the probability density function of discharged $\Delta SOC$ corresponding to the third stage is an area sandwiched by 0% and SOC in the third stage (50% in the case of FIG. 4).

The ratio defined by the storage-time product S1 in the first stage: the storage-time product S2 in the second stage: the storage-time product S3 in the third stage in the discharge plan may be weighted. In that case, the weight coefficient W is configured to have a progressively larger value through the stages (W_S1<W_S2<W_S3).

Further, the designer may organize the discharged $\Delta SOC$ discharged after long-term storage such that the cumulative distribution function has substantially equally spaced intervals, based on the cumulative distribution function of discharged $\Delta SOC$ discharged after long-term storage. FIG. 5B shows an example in which the discharged $\Delta SOC$ is organized by segmenting the cumulative distribution function at intervals of 20%. The cumulative distribution function of discharged $\Delta SOC$ of 20% covers the usage in which the discharged $\Delta SOC$ is 40% or lower. The cumulative distribution function of discharged SOC of 40% covers the usage in which the discharged SOC is 50% or lower. The cumulative distribution function of discharged $\Delta SOC$ of 60% covers the usage in which the discharged $\Delta SOC$ is 65% or lower. The cumulative distribution function of discharged SOC of 80% covers the usage in which the discharged $\Delta SOC$ is 80% or lower. The cumulative distribution function of discharged $\Delta SOC$ of 100% covers the usage in which the discharged SOC is 100% or lower.

The designer determines the SOC in each stage in the discharge plan based on the discharged ΔSOC thus organized. In the example shown in FIG. 5B, the SOC in the first stage is configured to be 100%, the SOC in the second stage is configured to be 80%, and the SOC in the third stage is configured to be 65%.

The ratio defined by SOC1 in the first stage:SOC2 in the second stage:SOC3 in the third stage in the discharge plan may be weighted. In that case, the weight coefficient W is configured to have a progressively larger value through the stages (W_SOC1<W_SOC2<W_SOC3).

The designer saves the discharge plan created from the above knowledge and including the SOC and the duration of stay in each stage in the storage 15. In the case data other than discharged ΔSOC (e.g., temperature, SOH, etc.) can be collected from the sample data, the horizontal axis of FIGS. 5A and 5B represents a difference between the storage deterioration speed indicator found before the discharge after long-term storage and the storage deterioration speed indicator found after the discharge.

The probability density function described above can be updated by learning. The discharge controller 142 acquires data such as discharged ΔSOC and temperature every time the secondary battery 20 in the battery system 1 hosting the discharge controller 142 (hereinafter, the host battery system 1) is discharged after long-term storage. The discharge controller 142 saves the acquired data in the storage 15. When one or more items of sample data is newly collected from the host battery system 1, the discharge controller 142 updates the current probability density function saved in the storage 15 with the probability density function including that sample data. The discharge controller 142 updates the discharge plan including the discharge deterioration speed indicator (or SOC) and the duration of stay in each stage, based on the updated probability density function. The larger the number of items of sample data collected from the host battery system 1, the more highly the probability density function reflects the action pattern of the user of the battery system 1 and the higher the precision of the discharge plan created.

When a discharging process during long-term storage is started, the discharge controller 142 can adjust the lower limit value of SOC in accordance with the temperature detected in the cells E1-E4. For example, the discharge controller 142 sets the value such that the higher the temperature of the cells E1-E4, the lower the lower limit value of SOC. If, in the case of using the discharge deterioration speed indicator, temperature is included as a parameter of the discharge deterioration speed indicator, it is not necessary to change the lower limit value of the discharge deterioration speed indicator. Impact of the temperature of the cells E1-E4 is reflected in the value of the discharge deterioration speed indicator. In other words, if the temperature of the cells E1-E4 is high, the discharge deterioration speed indicator is increased so that the lower limit value is not less easily reached.

As described above, according to the embodiment, the storage deterioration speed indicator (or SOC) is lowered to a target value by discharging the capacity of the secondary battery 20 in a plurality of stages during long-term storage of the battery system 1. In that process, the duration of stay in a state in which the storage deterioration speed indicator (or SOC) is high is configured to be short, and the duration of stay in a state in which the storage deterioration speed indicator (or SOC) is low is configured to be long. For example, the duration of stay is controlled to be progressively longer through the stages. Alternatively, the duration of stay is controlled such that the storage-time product (=storage deterioration speed indicator×duration of stay) is configured to be progressively larger through the stages. This makes it possible to meet the need to suppress storage deterioration during long-term storage and the need to secure available discharge capacity during long-term storage.

Balance between storage deterioration suppression and available discharge capacity can be adjusted by by varying the lower limit of SOC in accordance with the temperature or by including temperature as a parameter of the storage deterioration speed indicator. Alternatively, a suitable available discharge capacity can be secured by using a discharge plan during long-term storage created based on a usage record after long-term storage.

Described above is an explanation based on an exemplary embodiment. The embodiment is intended to be illustrative only and it will be obvious to those skilled in the art that various modifications to constituting elements and processes could be developed and that such modifications are also within the scope of the present disclosure.

Figure 6:
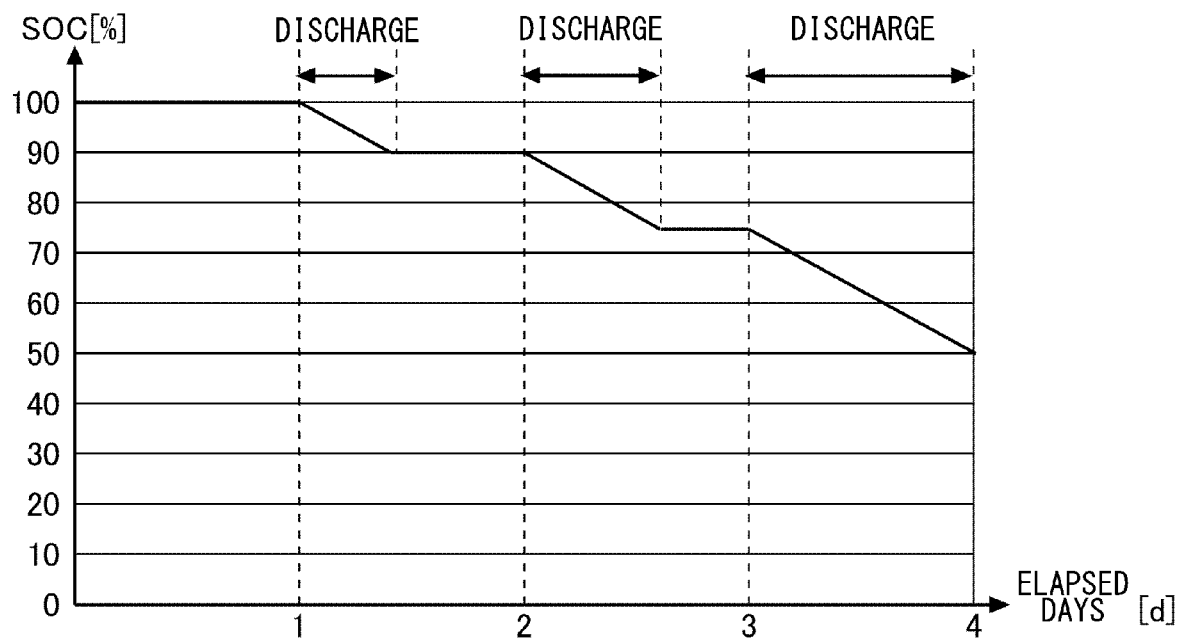
FIG. 6 is a chart illustrating a variation of the discharge plan during long-term storage of the secondary battery.

FIG. 6 is a chart illustrating a variation of the discharge plan during long-term storage of the secondary battery 20. In the variation, the duration of stay in a high-SOC zone is configured to be long, and the duration of stay in a low-SOC zone is configured to be short, contrary to the case of the embodiment. The period elapsed until the first discharge is configured to be long. If the battery is not used until the end of that period, it is determined that the battery will not be used thereafter, either, and the period elapsed until the subsequent discharging step is configured to be shorter. Stated otherwise, the duration of stay in each stage is configured to be progressively shorter through the stages.

In the discharge plan according to the variation, the decrement ΔSOC in a transition between stages is configured to be constant or to be progressively larger through the stages. In further accordance with the discharge plan according to the variation, the SOC and the duration of stay in each stage are set such that the storage-time product is progressively smaller through the stages. The SOC and the duration of stay in each stage may be set such that the storage-time products in a plurality of stages are substantially equal.

FIG. 6 shows an example in which a battery module of 50 [Ah] is discharged at a discharge capacity of 50 [mAh]. When the battery module is left at rest for 24 hours, the discharging process during long-term storage is started. In the first discharge, a capacity of 10% SOC is discharged over a period of 10 hours. In the second discharge, a capacity of 15% SOC is discharged over a period of 15 hours. In the third discharge, a capacity of 25% SOC is discharged over a period of 25 hours. Through these steps, 50% SOC, which is a target value of SOC during long-term storage, is reached. Although SOC is used to simplify the description of the variation, the storage deterioration speed indicator may be used in place of SOC as in the case of the embodiment.

In the embodiment described above, a case of creating a discharge plan based on a usage record after long-term storage is discussed. The discharge plan need not necessarily be created based on a usage record but may be created based on an predicted value. The discharge plan in that case is also subject to the above-described constraint condition related to the storage deterioration speed indicator (or SOC), duration of stay, and storage-time product.

The embodiment may be defined by the following items.
[Item 1]

A battery management device (10) including: a state estimator (141) that estimates, based on at least one of a voltage, a current, and a temperature of a secondary battery (20), a state of the secondary battery (20) including a state of charge (SOC) of the secondary battery (20); and a discharge controller (142) that discharges, when a state of non-use of the secondary battery (20) lasts for a predetermined period of time, the secondary battery (20) such that an indicator indicating easiness of storage deterioration of the secondary battery (20) to progress decreases in stages, wherein the indicator includes a parameter that depends on an SOC of the secondary battery, and a value of the indicator and a duration of stay in each stage are set such that a predetermined relationship holds between products in a plurality of stages, each of the products being derived from multiplying the value of the indicator and the duration of stay in each stage.

According to this embodiment, both the need to suppress deterioration during long-term storage of the secondary battery (20) and the need to secure available discharge capacity are met.

[Item 2]

The battery management device (10) according to Item 1, wherein a decrement of the indicator in a transition between stages is configured to be constant or to be progressively smaller through the stages.

According to this embodiment, the available discharge capacity is prevented from becoming too small.

[Item 3]

The battery management device (10) according to Item 1 or 2, wherein the value of the indicator and the duration of stay in each stage are set such that the product is progressively larger through the stages.

According to this embodiment, storage deterioration is suppressed, and the available discharge capacity is prevented from becoming too small.

[Item 4]

The battery management device (10) according to Item 1 or 2, wherein the value of the indicator and the duration of stay in each stage are set such that the products in the plurality of stages are substantially equal to each other.

According to this embodiment, storage deterioration is suppressed, and the available discharge capacity is prevented from becoming too small.

[Item 5]

The battery management device (10) according to any one of Items 1 through 4, wherein a proportion between the products in the plurality of stages is set based on a probability density function of discharged capacity discharged after long-term non-use, the probability density function being created by sampling a plurality of items of data for capacity discharged by using the secondary battery (20) after the state of non-use lasts for the predetermined period of time.

According to this embodiment, it is possible to create a discharge plan in which a suitable available discharge capacity is secured.

[Item 6]

The battery management device (10) according to any one of Items 1, 3, and 4, wherein the value of the indicator in each stage is set based on a cumulative distribution function of discharged capacity discharged after long-term non-use such that the cumulative distribution function has substantially equally spaced intervals, the cumulative distribution function being created by sampling a plurality of items of data for capacity discharged by using the secondary battery (20) after the state of non-use lasts for the predetermined period of time.

According to this embodiment, it is possible to create a discharge plan in which a suitable available discharge capacity is secured.

[Item 7]

The battery management device (10) according to Item 1, wherein the duration of stay in each stage is configured to be progressively shorter through the stages.

According to this embodiment, the available discharge capacity is prevented from becoming too small, and storage deterioration is suppressed.

[Item 8]

The battery management device (10) according to any one of Items 1 and 7, wherein the the value of the indicator and the duration of stay in each stage are set such that the product is progressively larger through the stages.

According to this embodiment, the available discharge capacity is prevented from becoming too small, and storage deterioration is suppressed.

[Item 9]

The battery management device (10) according to any one of Items 1 through 8, wherein a lower limit value of the indicator in a discharging process initiated by the discharge controller (142) when the state of non-use of the secondary battery (20) lasts for the predetermined period of time is set based on a usage record of the secondary battery (20) discharged after the state of non-use lasts for the predetermined period of time.

According to this embodiment, it is possible to set the lower limit of the indicator to a suitable value.

[Item 10]

The battery management device (10) according to any one of Items 1 through 9, wherein a lower limit value of the indicator in a discharging process initiated by the discharge controller (142) when the state of non-use of the secondary battery (20) lasts for the predetermined period of time is adjusted in accordance with a parameter that depends on an environment and/or a parameter that depends on a degree of deterioration of the secondary battery (20).

According to this embodiment, it is possible to set the lower limit of the indicator to a suitable value.

[Item 11]

The battery management device (10) according to any one of Items 1 through 9, wherein the indicator includes a parameter that depends on an environment and/or a parameter that depends on a degree of deterioration of the secondary battery (20), in addition to the parameter that depends on an SOC.

According to this embodiment, it is possible to manager storage deterioration of the secondary battery (20) more accurately.

[Item 12]

A battery system (1) comprising:

a secondary battery (20); and the battery management device (10) according to any one of Items 1 through 11 that manages the secondary battery (20).

According to this embodiment, both the need to suppress deterioration during long-term storage of the secondary battery (20) and the need to secure available discharge capacity are met.

[Item 13]

The battery system (1) according to Item 12, wherein the secondary battery (20) includes a plurality of cells (E1-En) connected in series, the battery system (1) further comprises a plurality of discharge resistances (R1-R4) for equalization respectively connected in parallel with the plurality of cells (E1-En), and the discharge controller (142) discharges the secondary battery (20) when a state of non-use of the secondary battery (20) lasts for a predetermined period of time, by discharging a capacity of the secondary battery (20) to the plurality of discharge resistances (R1-R4).

According to this embodiment, it is possible to reduce the capacity of the secondary battery (20) while the target load is not in operation.

[Item 14]

The battery system (1) according to Item 12, wherein the battery system (1) further comprises a fan (Lf) connected in parallel with the secondary battery (20) to cool the secondary battery (20), and the discharge controller (142) discharges the secondary battery (20) when a state of non-use lasts for a predetermined period of time, by discharging a capacity of the secondary battery (20) to the fan (Lf).

According to this embodiment, it is possible to reduce the capacity of the secondary battery (20) while the target load is not in operation.

[Item 15]

The battery system (1) according to Item 12, wherein the battery system (1) further comprises a battery for buffering (Eb) connected in parallel with the secondary battery (20), and the discharge controller (142) discharges the secondary battery (20) when a state of non-use lasts for a predetermined period of time, by discharging a capacity of the secondary battery (20) to the battery for buffering (Eb).

According to this embodiment, it is possible to reduce the capacity of the secondary battery (20) while the target load is not in operation.

[Item 16]

A power supply system for vehicles, comprising: the battery system (1) according to any one of Items 12 through 15; an inverter (2) that, during powering, converts a DC power supplied from the secondary battery (20) into an AC power and supplies the AC power to a motor (3) in the vehicle, and, during regeneration, converts an AC power supplied from the motor (3) into a DC power and supplies the DC power to the secondary battery (20); and a switch (RL) connected between the battery system (1) and the inverter (2).

According to this embodiment, both the need to suppress deterioration during long-term storage of the secondary battery (20) for vehicles and the need to secure available discharge capacity are met.

REFERENCE SIGNS LIST 1 battery system, 2 inverter, 3 motor, 10 battery management device, 11 voltage detector, 12 temperature detector, 13 current detector, 14 controller, 141 state estimator, 142 discharge controller, 15 storage, 16 driver, 20 secondary battery, E1-En cell, S1-S6 switch, R1-R4 discharge resistance, Rs shut resistance, RL relay, Lf cooling fan, Eb battery for buffering

The invention claimed is:

1. A battery management device comprising:
a state estimator that estimates, based on at least one of a voltage, a current, and a temperature of a secondary battery, a state of the secondary battery including a state of charge (SOC) of the secondary battery; and
a discharge controller that discharges, when a state of non-use of the secondary battery lasts for a predetermined period of time, the secondary battery such that an indicator indicating easiness of storage deterioration of the secondary battery to progress decreases in stages, wherein
the indicator includes a parameter that depends on the SOC of the secondary battery, and
a value of the indicator and a duration of stay in each stage are set such that a predetermined relationship holds between products in a plurality of the stages, each of the products being derived from multiplying the value of the indicator and the duration of stay in each stage.

2. The battery management device according to claim 1, wherein a decrement of the indicator in a transition between the stages is configured to be constant or to be progressively smaller through the stages.

3. The battery management device according to claim 1, wherein the value of the indicator and the duration of stay in each stage are set such that the product is progressively larger through the stages.

4. The battery management device according to claim 1, wherein the value of the indicator and the duration of stay in each stage are set such that the products in the plurality of the stages are substantially equal to each other.

5. The battery management device according to claim 1, wherein a proportion between the products in the plurality of the stages is set based on a probability density function of discharged capacity discharged after long-term non-use, the probability density function being created by sampling a plurality of items of data for capacity discharged by using the secondary battery after the state of non-use lasts for the predetermined period of time.

6. The battery management device according to claim 1, wherein the value of the indicator in each stage is set based on a cumulative distribution function of discharged capacity discharged after long-term non-use such that the cumulative distribution function has substantially equally spaced intervals, the cumulative distribution function being created by sampling a plurality of items of data for capacity discharged by using the secondary battery after the state of non-use lasts for the predetermined period of time.

7. The battery management device according to claim 1, wherein the duration of stay in each stage is configured to be progressively shorter through the stages.

8. The battery management device according to claim 1, wherein the value of the indicator and the duration of stay in each stage are set such that the product is progressively larger through the stages.

9. The battery management device according to claim 1, wherein a lower limit value of the indicator in a discharging process initiated by the discharge controller when the state of non-use of the secondary battery lasts for the predetermined period of time is set based on a usage record of the secondary battery discharged after the state of non-use lasts for the predetermined period of time.

10. The battery management device according to claim 1, wherein a lower limit value of the indicator in a discharging process initiated by the discharge controller when the state of non-use of the secondary battery lasts for the predetermined period of time is adjusted in accordance with a parameter that depends on an environment and/or a parameter that depends on a degree of deterioration of the secondary battery.

11. The battery management device according to claim 1, wherein the indicator includes a parameter that depends on an environment and/or a parameter that depends on a degree of deterioration of the secondary battery, in addition to the parameter that depends on the SOC.

12. A battery system comprising:
a secondary battery; and
the battery management device according to claim 1 that manages the secondary battery.

13. The battery system according to claim 12, wherein
the secondary battery includes a plurality of cells connected in series,
the battery system further comprises a plurality of discharge resistances for equalization respectively connected in parallel with the plurality of cells, and
the discharge controller discharges the secondary battery when the state of non-use of the secondary battery lasts for the predetermined period of time, by discharging a capacity of the secondary battery to the plurality of discharge resistances.

14. The battery system according to claim 12, wherein
the battery system further comprises a fan connected in parallel with the secondary battery to cool the secondary battery, and
the discharge controller discharges the secondary battery when the state of non-use lasts for the predetermined period of time, by discharging a capacity of the secondary battery to the fan.

15. The battery system according to claim 12, wherein
the battery system further comprises a battery for buffering connected in parallel with the secondary battery, and
the discharge controller discharges the secondary battery when the state of non-use lasts for the predetermined period of time, by discharging a capacity of the secondary battery to the battery for buffering.

16. A power supply system for vehicles, comprising:
the battery system according to claim 12;
an inverter that, during powering, converts a DC power supplied from the secondary battery into an AC power and supplies the AC power to a motor in the vehicle, and, during regeneration, converts an AC power supplied from the motor into a DC power and supplies the DC power to the secondary battery; and
a switch connected between the battery system and the inverter.

* * * * *